(12) United States Patent
Lee et al.

(10) Patent No.: US 10,522,475 B2
(45) Date of Patent: Dec. 31, 2019

(54) VERTICAL INTERCONNECTS FOR SELF SHIELDED SYSTEM IN PACKAGE (SiP) MODULES

(71) Applicant: Apple Inc., Cupertino, CA (US)

(72) Inventors: Meng Chi Lee, Los Altos, CA (US); Shakti S. Chauhan, Cupertino, CA (US); Flynn P. Carson, Redwood City, CA (US); Jun Chung Hsu, Cupertino, CA (US); Tha-An Lin, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/142,137

(22) Filed: Sep. 26, 2018

(65) Prior Publication Data

US 2019/0027445 A1 Jan. 24, 2019

Related U.S. Application Data

(63) Continuation of application No. 15/630,346, filed on Jun. 22, 2017, now Pat. No. 10,115,677, which is a
(Continued)

(51) Int. Cl.
*H01L 23/552* (2006.01)
*H01L 23/528* (2006.01)
(Continued)

(52) U.S. Cl.
CPC .......... *H01L 23/552* (2013.01); *H01L 21/486* (2013.01); *H01L 21/4853* (2013.01);
(Continued)

(58) Field of Classification Search
CPC ....... H01L 23/552; H01L 24/96; H01L 24/97; H01L 21/56; H01L 23/3157;
(Continued)

(56) References Cited

U.S. PATENT DOCUMENTS 7,187,060 B2 3/2007 Usui
7,443,693 B2 10/2008 Arnold et al.
(Continued)

FOREIGN PATENT DOCUMENTS

CN 102254901 B 12/2013
KR 20130042171 A 4/2013

OTHER PUBLICATIONS

U.S. Appl. No. 14/947,353, filed Nov. 20, 2015, entitled "Self Shielded System in Package (SiP) Modules," inventors Meng Chi Lee, Shakti S. Chauhan, Flynn P. Carson, Jun Chung Hsu, Tha-An Lin.
(Continued)

*Primary Examiner* — Victor A Mandala
(74) *Attorney, Agent, or Firm* — Kowert, Hood, Munyon, Rankin & Goetzel, P.C.; Gareth M. Sampson

(57) ABSTRACT

A system in package (SiP) is disclosed that uses an EMI shield to inhibit EMI or other electrical interference on the components within the SiP. A metal shield may be formed on an upper surface of an encapsulant encapsulating the SiP. The metal shield may be electrically coupled to a ground layer in a printed circuit board (PCB) to form the EMI shield around the SiP. The metal shield may be electrically coupled to the ground layer using one or more conductive structures located in the encapsulant. The conductive structures may be located on a perimeter of the components in the SiP. The conductive structures may provide a substantially vertical connection between the substrate and the shield on the upper surface of the encapsulant.

19 Claims, 13 Drawing Sheets

Related U.S. Application Data continuation of application No. 14/976,199, filed on Dec. 21, 2015, now Pat. No. 9,721,903.

(51) Int. Cl.
| | |
|---|---|
| *H01L 23/31* | (2006.01) |
| *H01L 23/522* | (2006.01) |
| *H01L 21/48* | (2006.01) |
| *H01L 21/56* | (2006.01) |
| *H01L 23/00* | (2006.01) |

(52) U.S. Cl.
CPC .......... *H01L 21/56* (2013.01); *H01L 23/3157* (2013.01); *H01L 23/528* (2013.01); *H01L 23/5226* (2013.01); *H01L 24/96* (2013.01); *H01L 24/97* (2013.01); *H01L 21/561* (2013.01); *H01L 21/568* (2013.01); *H01L 23/3128* (2013.01); *H01L 2224/04105* (2013.01); *H01L 2224/12105* (2013.01); *H01L 2224/131* (2013.01); *H01L 2224/16227* (2013.01); *H01L 2224/97* (2013.01); *H01L 2924/10253* (2013.01); *H01L 2924/1431* (2013.01); *H01L 2924/1434* (2013.01); *H01L 2924/1436* (2013.01); *H01L 2924/15311* (2013.01); *H01L 2924/1815* (2013.01); *H01L 2924/19041* (2013.01); *H01L 2924/19043* (2013.01); *H01L 2924/19105* (2013.01); *H01L 2924/3025* (2013.01)

(58) Field of Classification Search
CPC . H01L 23/528; H01L 21/486; H01L 21/4853; H01L 23/5226; H01L 23/3128; H01L 21/561; H01L 21/568; H01L 2924/3025; H01L 2924/19105; H01L 2924/19043; H01L 2924/19041; H01L 2924/1815; H01L 2924/15311; H01L 2924/1436; H01L 2924/1434; H01L 2924/1431; H01L 2924/10253; H01L 2224/97; H01L 2224/16227; H01L 2224/131; H01L 2224/12105; H01L 2224/04105
See application file for complete search history.

(56) References Cited

U.S. PATENT DOCUMENTS

| | | | |
|---|---|---|---|
| 7,629,674 B1 * | 12/2009 | Foster | H01L 21/56 257/659 |
| 8,008,753 B1 | 8/2011 | Bolognia | |
| 8,138,024 B2 | 3/2012 | Do et al. | |
| 8,183,130 B2 | 5/2012 | Lee et al. | |
| 8,378,466 B2 | 2/2013 | Chiu et al. | |
| 8,379,400 B2 | 2/2013 | Sunohara | |
| 8,653,633 B2 | 2/2014 | Liao et al. | |
| 8,710,676 B2 | 4/2014 | Chou et al. | |
| 8,786,060 B2 * | 7/2014 | Yen | H01L 23/552 257/660 |
| 9,001,528 B2 | 4/2015 | Yorita et al. | |
| 9,123,718 B1 | 9/2015 | Foster | |
| 9,721,903 B2 | 8/2017 | Lee et al. | |
| 2009/0014847 A1 | 1/2009 | Chen et al. | |
| 2009/0168386 A1 | 7/2009 | Suzuki et al. | |
| 2009/0184414 A1 | 7/2009 | Park et al. | |
| 2010/0096741 A1 | 4/2010 | Pan et al. | |
| 2010/0252937 A1 | 10/2010 | Uchiyama | |
| 2011/0006408 A1 | 1/2011 | Liao | |
| 2011/0260301 A1 | 10/2011 | Liao | |
| 2011/0304011 A1 * | 12/2011 | Lee | H01L 21/561 257/531 |
| 2012/0043668 A1 | 2/2012 | Refai-Ahmed et al. | |
| 2012/0049347 A1 | 3/2012 | Wang | |
| 2012/0139090 A1 | 6/2012 | Kim et al. | |
| 2012/0280366 A1 * | 11/2012 | Kamgaing | H01L 23/481 257/621 |
| 2013/0020685 A1 * | 1/2013 | Kwak | H01L 23/552 257/659 |
| 2013/0082368 A1 | 4/2013 | Kim et al. | |
| 2013/0133940 A1 | 5/2013 | Chen et al. | |
| 2014/0150102 A1 | 5/2014 | Wang et al. | |
| 2014/0246781 A1 | 9/2014 | Hosomi | |
| 2015/0061095 A1 | 3/2015 | Choi et al. | |
| 2015/0084192 A1 | 3/2015 | Chiu et al. | |
| 2016/0073496 A1 * | 3/2016 | Vincent | H05K 1/0298 361/772 |
| 2016/0176701 A1 * | 6/2016 | Gupta | B81B 7/0064 257/254 |
| 2017/0025361 A1 | 1/2017 | Lee et al. | |
| 2017/0098634 A1 * | 4/2017 | Kumar | H04W 4/80 |
| 2017/0301631 A1 | 10/2017 | Lee et al. | |

OTHER PUBLICATIONS

PCT/US2016/041139 , filed Jul. 6, 2016, International Search Report and Written Opinion, dated Oct. 4, 2016, 14 pages.

U.S. Appl. No. 14/946,199, filed Dec. 21, 2015, entitled "Vertical Interconnects for Self Shielded System in Package (SIP) Modules ," inventors Meng Chi Lee, Shakti S. Chauhan, Flynn P. Carson, Jun Chung Hsu,Tha-An Lin.

U.S. Appl. No. 15/630,346, filed Jun. 22, 2017, entitled "Vertical Interconnects for Self Shielded System in Package (SIP) Modules ," inventors Meng Chi Lee, Shakti S. Chauhan, Flynn P. Carson, Jun Chung Hsu,Tha-An Lin.

* cited by examiner

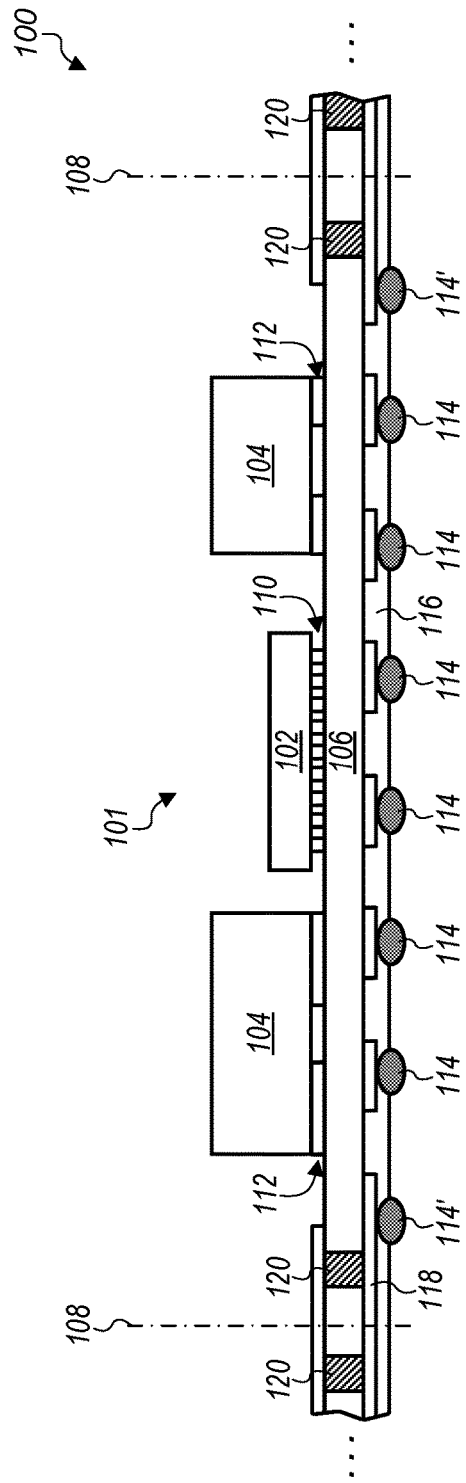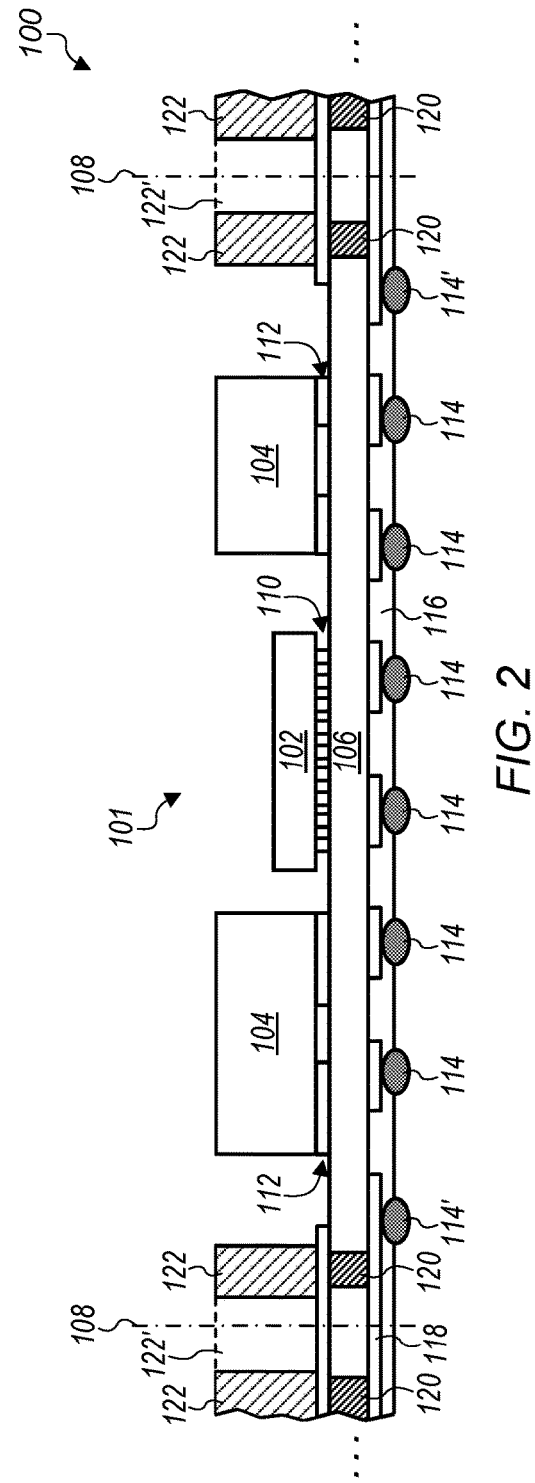

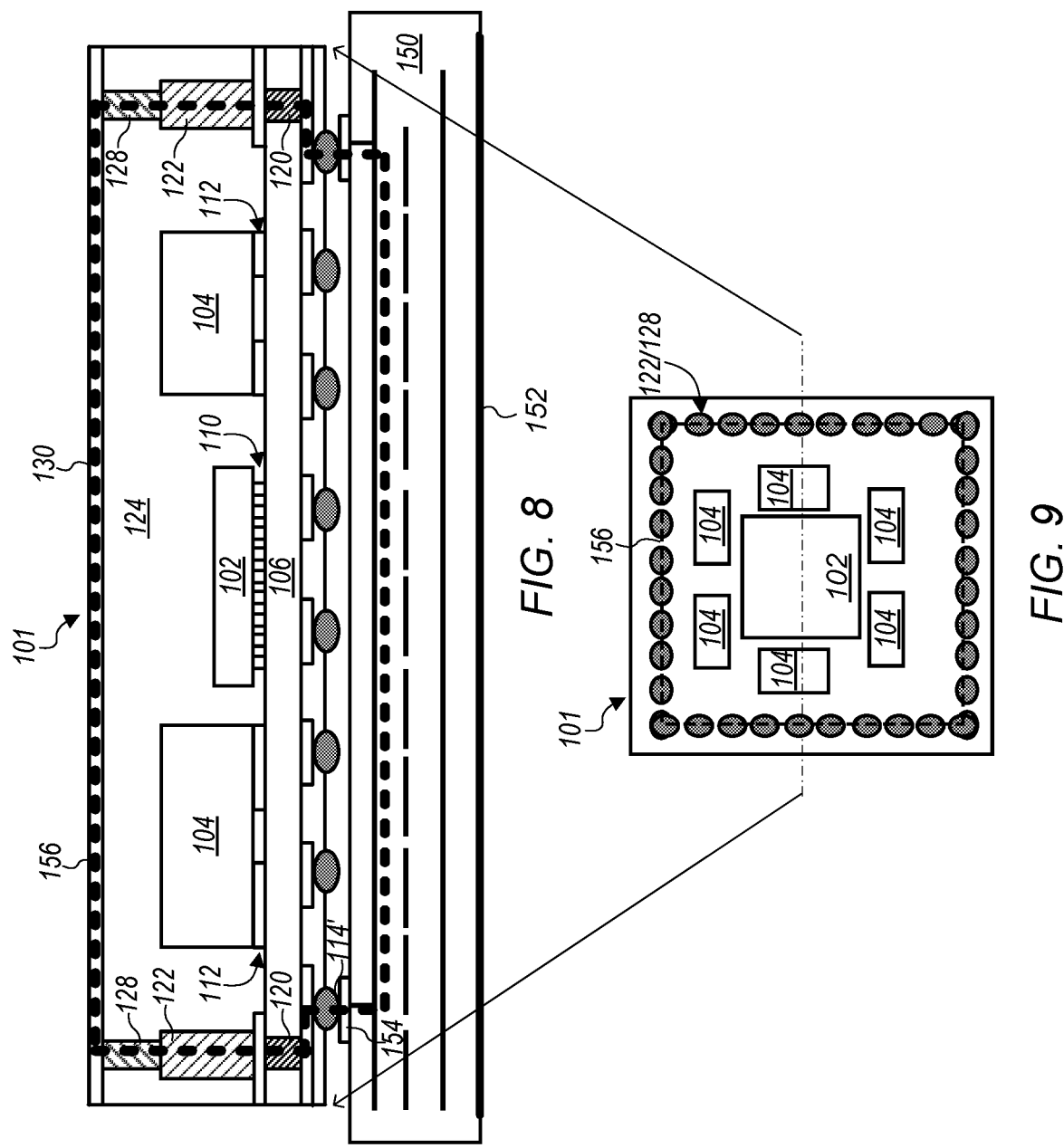

VERTICAL INTERCONNECTS FOR SELF SHIELDED SYSTEM IN PACKAGE (SIP) MODULES

PRIORITY INFORMATION

This application is a continuation of U.S. patent application Ser. No. 15/630,346, filed Jun. 22, 2017, which is a continuation of U.S. patent application Ser. No. 14/976,199, filed Dec. 21, 2015 (now U.S. Pat. No. 9,721,903), each of which is incorporated by reference herein in its entirety.

BACKGROUND

1. Technical Field

Embodiments described herein relate to system in packages (SiPs) and methods for making SiPs. More particularly, embodiments described herein relate to systems and methods for shielding SiPs from electromagnetic interference.

2. Description of Related Art

An SiP (system in package or system-in-a-package) includes one or more integrated circuits enclosed in a single module (e.g., a single package). The SiP may perform many (or all) of the functions of an electronic system. SiPs are typically used inside smaller electronic devices such as, but not limited to, mobile phones, digital music players, and tablets. An example of an SiP may include several chips (e.g., a specialized processor, DRAM, and/or flash memory) combined with passive components (e.g., resistors and capacitors) mounted on a single substrate. Mounting all the components on the single substrate provides a complete functional unit that can be built in a multi-chip package and few external components may be needed to make the device work. A drawback to SiPs is that any defective chip in the package will result in a non-functional packaged integrated circuit, even if all the remaining modules in the same package are functional.

EMI ("electromagnetic interference") is the unwanted effects in the electrical system due to electromagnetic (e.g., radio frequency (RF)) radiation and electromagnetic conduction. Electromagnetic radiation and electromagnetic conduction are different in the way an EM field propagates. Conducted EMI is caused by the physical contact of the conductors as opposed to radiated EMI which is caused by induction. Electromagnetic disturbances in the EM field of a conductor will no longer be confined to the surface of the conductor and may radiate away from it. Mutual inductance between two radiated electromagnetic fields may result in EMI.

Due to EMI, the electromagnetic field around the conductor is no longer evenly distributed (e.g., resulting in skin effects, proximity effects, hysteresis losses, transients, voltage drops, electromagnetic disturbances, EMP/HEMP, eddy current losses, harmonic distortion, and reduction in the permeability of the material).

EMI can be conductive and/or radiative and its behavior is dependent on the frequency of operation and cannot be controlled at higher frequencies. For lower frequencies, EMI is caused by conduction (e.g., resulting in skin effects) and, for higher frequencies, by radiation (e.g., resulting in proximity effects).

A high frequency electromagnetic signal makes every conductor an antenna, in the sense that they can generate and absorb electromagnetic fields. In the case of a printed circuit board ("PCB"), consisting of capacitors and semiconductor devices soldered to the board, the capacitors and soldering function like antennas, generating and absorbing electromagnetic fields. The chips on these boards are so close to each other that the chances of conducted and radiated EMI are significant. Boards are designed in such a way that the case of the board is connected to the ground and the radiated EMI is typically diverted to ground. Technological advancements have drastically reduced the size of chipboards and electronics and locating SiPs along with other components closer and closer together. The decreasing distances between components, however, means that chips (e.g., SiPs) are also becoming more sensitive to EMI. Typically electromagnetic shielding is used to inhibit EMI effects. However, EMI shielding for SiPs may be difficult and process intensive to integrate into the SiP structure.

Many current shielding implementations use a post-singulation metal deposition process (e.g., sputtering or plating) to form the EMI shield on an SiP structure. Post-singulation metal deposition, however, relies on the metal deposition process connecting the deposited metal with ground layers in the substrate of the SiP. Making such connections may be difficult for thin substrates and may require special handling and sputtering equipment.

SUMMARY

In certain embodiments, a system in package (SiP) includes one or more die and one or more passive devices. The die and passive devices may be enclosed in an EMI shield to inhibit EMI or other electrical interference on the components within the SiP. The die and passive devices may be encapsulated in an encapsulant along with one or more conductive structures that extend between a substrate (or lower terminals in a substrate-less SiP) and the upper surface of the encapsulant. The conductive structures may couple ground rings in the SiP (e.g., ground rings on a lower surface of the substrate or ground rings coupled to the lower terminals) to a shield (e.g., metal layer) formed on the upper surface of the encapsulant. The ground rings may be electrically coupled to a ground layer in a printed circuit board (PCB) (or other substrate) when the SiP is coupled to the PCB. Coupling the shield, the conductive structures, the ground rings, and the ground layer may form the EMI shield around the components of the SiP.

In certain embodiments, conductive material is used to couple the conductive structures to the shield on the upper surface of the encapsulant. The conductive material may include conductive material filling one or more trenches or vias formed in the encapsulant down to the conductive structures after encapsulation of the SiP components and the conductive structures. In some embodiments, the conductive structures and/or the conductive material provide a substantially vertical connection between the substrate (or lower terminals) and the shield on the upper surface of the encapsulant on the perimeter of the components in the SiP. In some embodiments, one or more conductive structures and/or conductive material are used between components in the SiP to provide compartmental shielding within the SiP (e.g., shielding between the components).

The conductive structures, the conductive material, and the shield on the upper surface of the encapsulant may be formed on the SiP during panel-level processing (e.g., before singulation of a panel structure with multiple SiPs to form individual SiPs). Additionally, encapsulation is formed on the SiP during panel-level processing. Thus, metallization and other processing steps needed for forming the conductive structures, the conductive material, and the shield are done simultaneously on multiple SiPs on a single panel before singulation. The conductive structures and/or the conductive material allow coupling between the shield on the upper surface of the encapsulant and the ground rings on the substrate (or lower terminals) without the need for vertical side-wall deposition and/or oversputtering techniques.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which:

FIG. 1 depicts a side-view cross-sectional representation of an embodiment of a structure used to form multiple system in packages (SiPs).

FIG. 2 depicts a side-view cross-sectional representation of an embodiment of a structure with conductive structures coupled to the upper surface of the substrate.

FIG. 8 depicts a side-view cross-sectional representation of an embodiment of an SiP coupled to a printed circuit board (PCB).

FIG. 9 depicts a top view representation of the embodiment depicted in FIG. 8.

Figure 3:
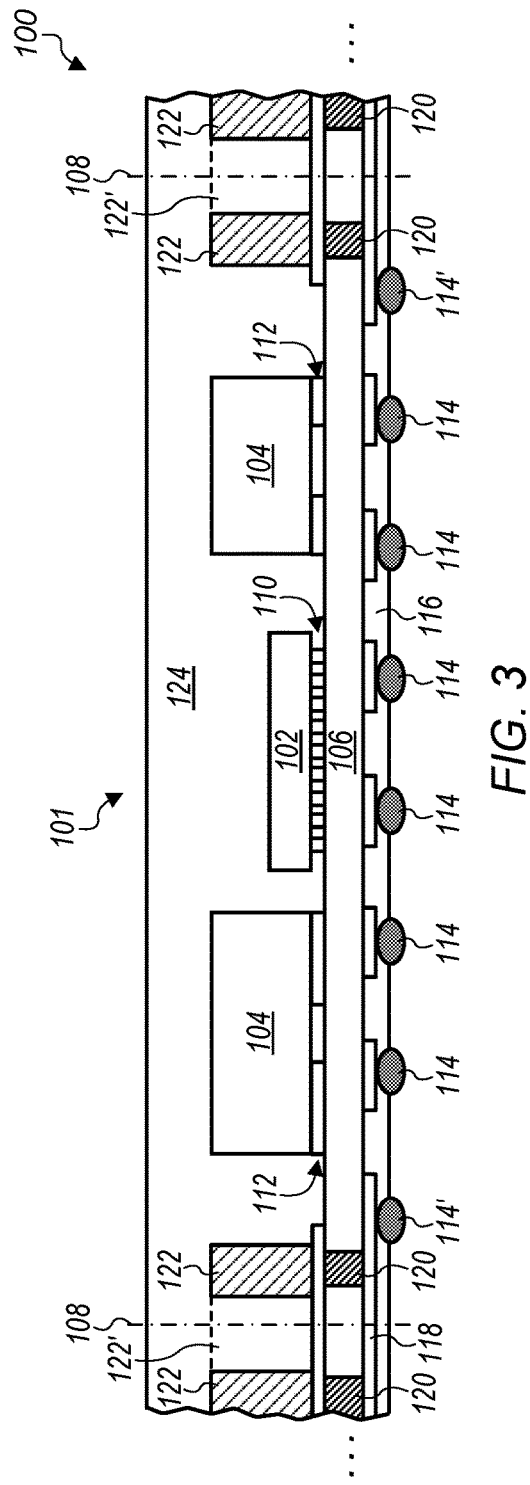
FIG. 3 depicts a side-view cross-sectional representation of an embodiment of a structure encapsulated in encapsulant.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. The hardware circuits may include any combination of combinatorial logic circuitry, clocked storage devices such as flops, registers, latches, etc., finite state machines, memory such as static random access memory or embedded dynamic random access memory, custom designed circuitry, programmable logic arrays, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

FIG. 1 depicts a side-view cross-sectional representation of an embodiment of a structure used to form multiple system in packages (SiPs). In certain embodiments, structure 100 includes die 102 and passive devices 104 coupled to an upper surface of substrate 106. Sets of die 102 and passive devices 104 may be laid out on substrate 106 to define one or more SiPs formed later by singulation of the substrate. For example, singulation lines 108 define SiP 101 to be formed on substrate 106. In certain embodiments, SiP 101 includes at least one die 102. In some embodiments, SiP 101 includes only passive devices 104 (e.g., the SiP is a passive SiP). In some embodiments, SiP 101 includes more than one die 102.

Die 102 may include, for example, silicon die or integrated circuit die such as processor die or logic die. In some embodiments, die 102 include DRAM or other memory die. Passive devices 104 may include passive components such as, but not limited to, resistors and capacitors. Die 102 may be coupled to substrate 106 with terminals 110. Terminals 112 may couple passive devices 104 to substrate 106. In certain embodiments, terminals 110 and terminals 112 include pads, solder bumps, or combinations pads and solder bumps. In some embodiments, terminals 110 and/or terminals 112 include a redistribution layer (e.g., a layer that redistributes (horizontally offsets) connections on opposite sides of the layer).

Substrate 106 may be a thin substrate such as a coreless substrate or a dielectric core substrate with metal layers. In certain embodiments, substrate 106 is a two-layer substrate having a dielectric core and two metal layers. In certain embodiments, substrate 106 has a thickness of at most about 60 μm. In some embodiments, substrate 106 has a thickness of at most about 100 μm, at most about 75 μm, or at most about 50 μm. In some embodiments, substrate 106 is a redistribution layer. A redistribution layer may be a dielectric layer with one or more layers of conductive routing that redistributes connections on one side of the redistribution layer to another displaced (e.g., horizontally displaced) location on the other side of the redistribution layer (e.g., the routing interconnects connections (terminals) on the top and bottom of the redistribution layer that are horizontally offset). In some embodiments, substrate 106 is a multilayer board (MLB). In some embodiments, substrate 106 is a temporary substrate (e.g., the substrate is removed to form a substrate-less SiP).

In certain embodiments, terminals 114 are coupled to a lower surface of substrate 106. Terminals 114 may include pads, solder bumps, or combinations of pads and solder bumps. Underfill material 116 may substantially surround terminals 114 on the lower surface of substrate 106. Underfill material 116 may be, for example, solder resist. Terminals 114 are exposed through underfill material 116 so that the terminals can couple substrate 106 to another component or device (e.g., a printed circuit board).

In certain embodiments, ground rings 118 are formed on the lower surface of substrate 106. Ground rings 118 may be formed at or near singulation lines 108 such that the ground rings will be at the ends of SiP 101. Ground rings 118 may couple to terminals 114' (e.g., the outermost terminals for the SiP). In certain embodiments, metallization 120 connects to ground rings 118 through substrate 106. Metallization 120 may be, for example, via metallization through substrate 106 (e.g., metallization deposited in vias formed through the substrate). Metallization 120 may, however, include any routing through substrate 106 between the upper surface of the substrate and ground rings 118.

In certain embodiments, one or more conductive structures are coupled to the upper surface of substrate 106. FIG. 2 depicts a side-view cross-sectional representation of an embodiment of structure 100 with conductive structures 122 coupled to the upper surface of substrate 106. In certain embodiments, conductive structures 122 are separately (e.g., individually) coupled or attached to the upper surface of substrate 106. Conductive structures 122 may be, for example, surface-mount technology (SMT) shims or bars, sputtered structures, soldered structures, or plated structures (e.g., pillars or pads). In certain embodiments, conductive structures 122 include metal such as iron, copper, nickel, or combinations thereof. In some embodiments, conductive structures are foil structures. In some embodiments, conductive structures 122 are formed on a seed layer of material (e.g., a seed metal layer) on the upper surface of substrate 106). For example, a seed metal layer may be used for plating conductive structures 122 on substrate 106.

In certain embodiments, conductive structures 122 are placed (e.g., formed or coupled) on the upper surface of substrate 106 after die 102 and/or passive devices 104 are coupled to the upper surface of the substrate. Conductive structures 122 may, however, be placed on the upper surface of substrate 106 at any point during a processing flow. For example, conductive structures 122 may be placed on the upper surface of substrate 106 before die 102 and/or passive devices 104 or the conductive structures may be placed on the upper surface of the substrate at the same time as one or more of the die and/or passive devices.

As shown in FIG. 2, conductive structures 122 have a height (thickness) on the order of die 102 and passive devices 104 above the upper surface of substrate 106. In some embodiments, conductive structures 122 have a height above substrate 106 that is equal to or greater than the height of passive devices 104 above the substrate, as shown in FIG. 2. It is to be understood, however, that conductive structures 122 may have a variety of heights above the upper surface of substrate 106. For example, conductive structures 122 may be a thin layer of conductive material above the upper surface of substrate 106.

In certain embodiments, conductive structures 122 couple to metallization 120 in substrate 106. Thus, conductive structures 122 are coupled to ground rings 118 through metallization 120. In certain embodiments, conductive structures 122 (and metallization 120) are positioned near singulation lines 108 that define the edges of SiP 101. In some embodiments, conductive structures 122 span across singulation lines 108 (as shown by dashed lines 122' in FIG. 2). In such embodiments, conductive structures 122 for two adjacent SiPs share the same conductive structure, which is then separated during singulation.

After conductive structures 122, die 102, and passive devices 104 are placed on the upper surface of substrate 106, structure 100 may be encapsulated on the surface of the substrate by encapsulation 124, as shown in FIG. 3. Encapsulant 124 may include, but not be limited to, a polymer or a mold compound such as an overmold or exposed mold compound. Encapsulant 124 may encapsulate die 102, passive devices 104, and conductive structures 122 on the upper surface of substrate 106 to protect the die and the passive devices. As shown in FIG. 3, conductive structures 122 may have a height above substrate 106 that is less than a height of encapsulant 124 above the substrate.

Figure 4:
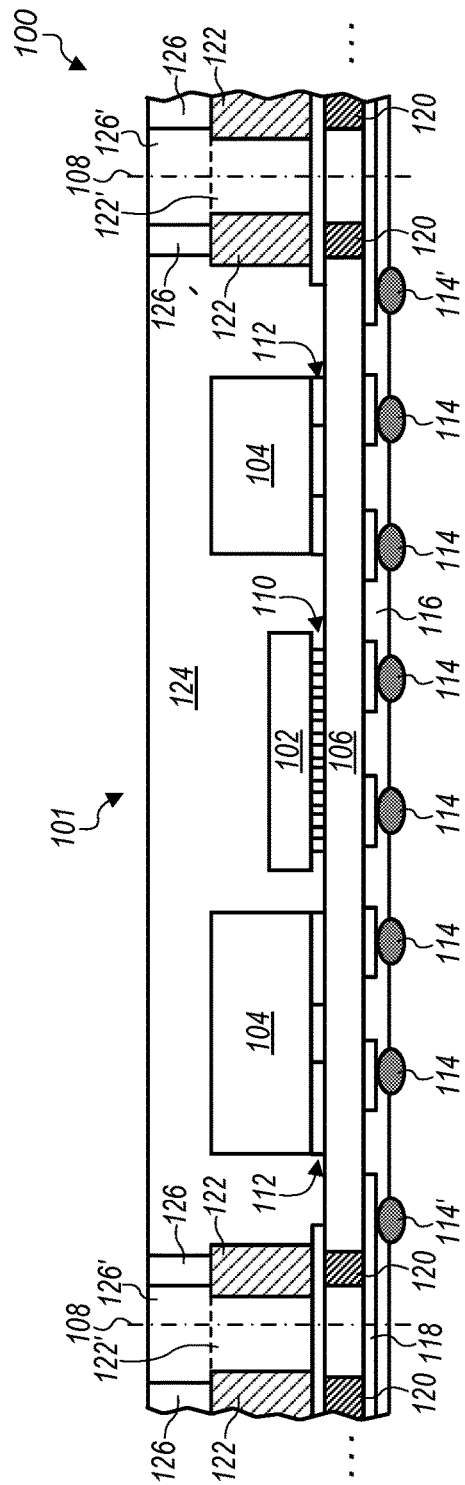
FIG. 4 depicts a side-view cross-sectional representation of an embodiment of a structure with trenches formed in encapsulation.

After encapsulation, one or more trenches may be formed through encapsulation 124 to conductive structures 122. FIG. 4 depicts a side-view cross-sectional representation of an embodiment of structure 100 with trenches 126 formed in encapsulation 124. In certain embodiments, trenches 126 are laser formed vias in encapsulation 124. Trenches 126 may, however, be any form of trench or via formed in encapsulation 124. In certain embodiments, trenches 126 are formed to connect to conductive structures 122 from the upper surface of encapsulation 124. In certain embodiments, trenches 126 have substantially vertical sidewalls, as shown in FIG. 4. Trenches 126 may, however, have sidewalls with at least some non-vertical portions (e.g., the trenches may be v-shaped or u-shaped).

In certain embodiments, as shown in FIG. 4, trenches 126 are formed to connect to conductive structures 122 on either side of singulation lines 108. For example, trenches 126 are small trenches on either side of singulation lines 108 that connect to conductive structures 122 on either side of the singulation lines or a single conductive structure represented by conductive structures 122 and dashed line 122'. In some embodiments, trenches 126 span across singulation lines 108 (e.g., the trenches include center trench sections 126', shown in FIG. 4). In such embodiments, trenches 126 are wide trenches that span across two adjacent SiPs (as shown in the embodiment depicted in FIG. 17) and are then separated during singulation (with conductive material filling the trench as described below).

Figure 5:
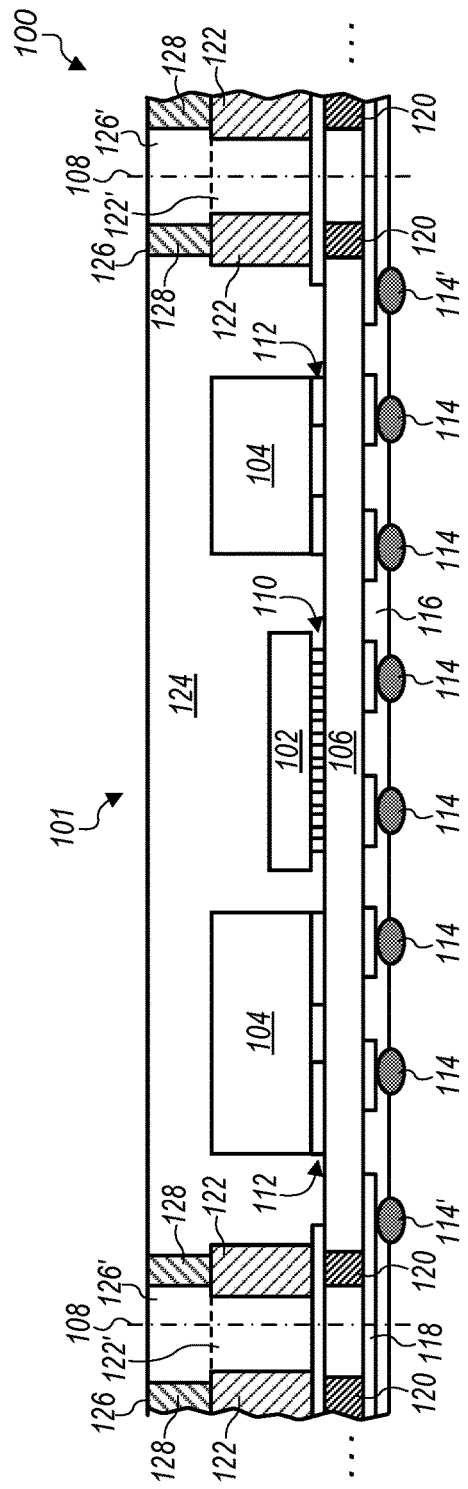
FIG. 5 depicts a side-view cross-sectional representation of an embodiment of a structure with conductive material filling trenches.

After trenches 126 are formed, conductive material may be deposited (e.g., filled) into the trenches. FIG. 5 depicts a side-view cross-sectional representation of an embodiment of structure 100 with conductive material 128 filling trenches 126. In certain embodiments, conductive material 128 is metal (e.g., copper, gold, aluminum, ferrite, carbonyl iron, stainless steel, nickel silver, nickel, silver, copper-solder compositions, low-carbon steel, silicon-iron steel, foil, conductive resin, other metals, composites, soft magnetic metals (e.g. nickel iron (Ni—Fe), cadmium zinc telluride (CZT), etc.), or combinations thereof). Conductive material 128 may be filled into trenches using, for example, paste or other via filling materials, wire-bonds, wire bond loops, or combinations thereof. Filling trenches 126 with conductive material 128 may individually attaches the conductive material to conductive structures 122. Thus, conductive structures 122 and conductive material 128 may form separated structures that are attached to the upper surface of substrate 106. Filling trenches 126 with conductive material 128 provides an electrical connection between ground ring 118 and the upper surface of encapsulant 124 as the conductive material extends from the upper surfaces of conductive structures 122 to the upper surface of the encapsulant and the conductive material is coupled to the ground ring through conductive structures 122 and metallization 120.

In certain embodiments, a combined height of conductive structures 122 and conductive material 128 above the upper surface of substrate 106 is higher than a height of the tallest of die 102 and passive devices 104 (e.g., the combined height of the conductive structures and the conductive material is taller than any other component/device on the upper surface of the substrate). Having such a combined height ensures that any shield formed on structure 100 does not contact die 102 or passive devices 104.

Figure 6:
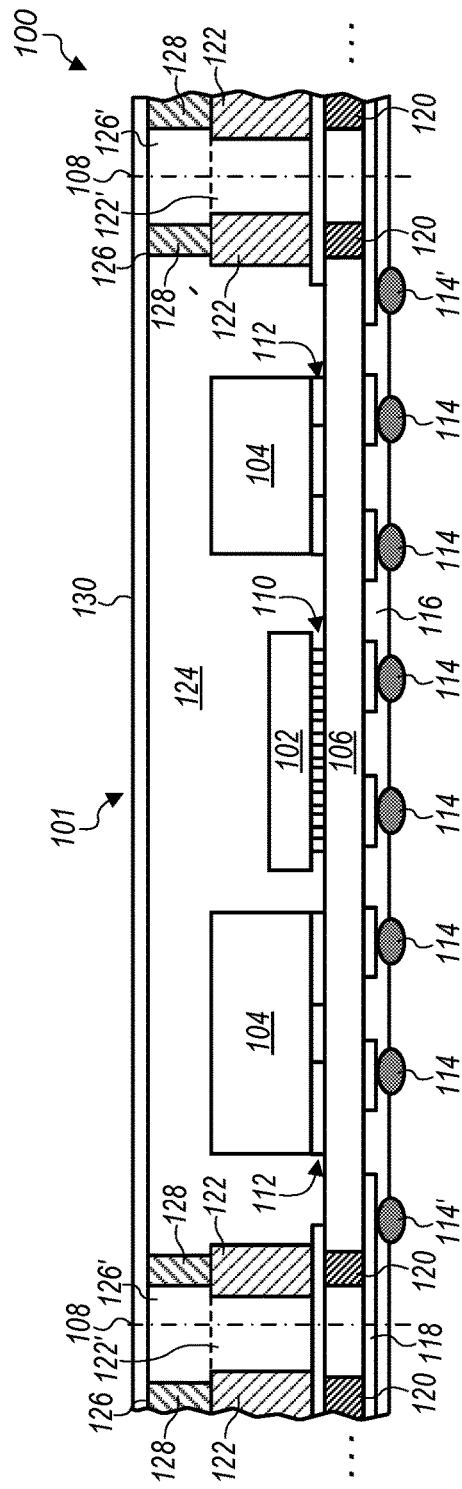
FIG. 6 depicts a side-view cross-sectional representation of an embodiment of a structure with a shield formed on the structure.

After trenches 126 are filled with conductive material 128, shield 130 may be formed on the upper surface of encapsulant 124 in structure 100, as shown in FIG. 6. Shield 130 may be formed by metal deposition such as sputtering or electroplating. In certain embodiments, shield 130 is a copper shield. In some embodiments, shield includes multiple layers of different materials. For example, a thin layer of stainless steel may be formed on a copper layer to protect the copper. In some embodiments, shield 130 includes copper with a thickness between about 5 µm and about 10 µm with a stainless steel layer of about 1 µm thickness over the copper. In some embodiments, shield 130 may include aluminum, ferrite, carbonyl iron, stainless steel, nickel silver, nickel, silver, copper-solder compositions, low-carbon steel, silicon-iron steel, foil, conductive resin, other metals, composites, soft magnetic metals (e.g. nickel iron (Ni—Fe), cadmium zinc telluride (CZT), etc.), or combinations thereof that are capable of blocking or absorbing EMI, RFI (radio frequency interference), magnetic, and other inter-device interference. In some embodiments, shield 130 may include a non-metal material such as carbon-black or aluminum flake to reduce the effects of EMI and RFI. For non-metal materials, shield 130 may be applied by lamination, spraying, or painting.

As conductive material 128 is exposed at the upper surface of encapsulant 124, the conductive material couples to shield 130 when the shield is formed (e.g., deposited) on the upper surface of the encapsulant. In some embodiments, conductive material 128 (and attached conductive structures 122) are individually coupled to shield 130 as the conductive material and the conductive structures are separated structures. Even if, in some cases, conductive material 128 is not flush with the upper surface of encapsulant 124 (e.g., the conductive material does not fully fill trenches 126), deposition of shield 130 may fill in any unfilled portion of the trenches and couple the shield to the conductive material. For example, shield 130 deposition may be conformal deposition along both horizontal and non-horizontal surfaces to ensure shield connectivity along the upper surface of encapsulant 124.

Figure 7:
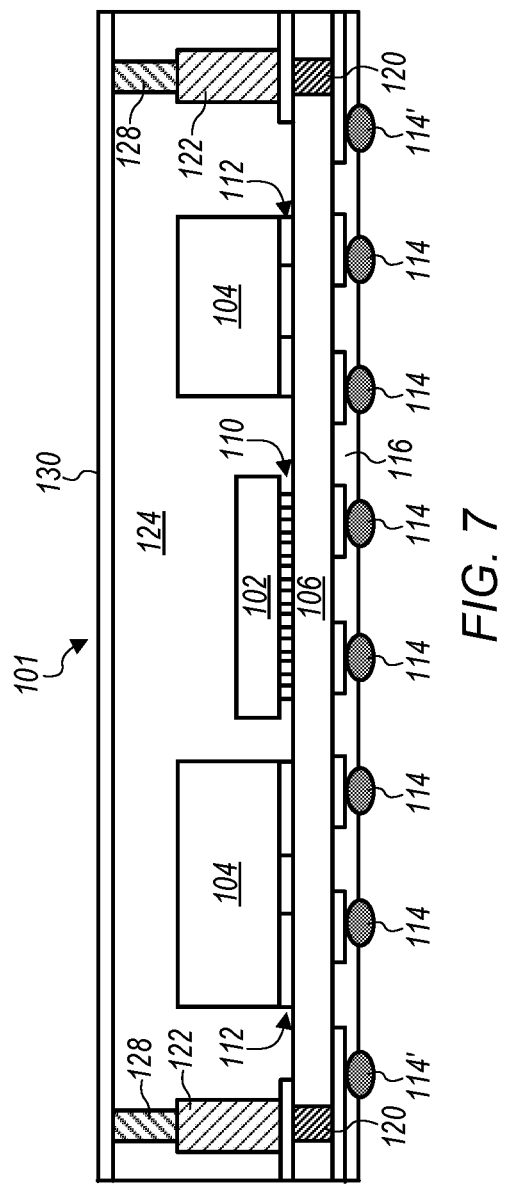
FIG. 7 depicts a side-view cross-sectional representation of an embodiment of an SiP after singulation.

After shield 130 is formed on the upper surface of encapsulant 124, structure 100 may be singulated along singulation lines 108 to form one or more SiPs 101. FIG. 7 depicts a side-view cross-sectional representation of an embodiment of SiP 101 after singulation. In certain embodiments, singulation includes dicing or laser singulation along singulation lines 108. In certain embodiments, as shown in FIGS. 1-6, singulation occurs between adjacent conductive structures 122 and trenches 126. In some embodiments, as described herein, structure 100 includes conductive structures 122 and/or trenches 126 that span singulation lines 108. In such embodiments, singulation may occur through conductive structures 122 and/or trenches 126. Accordingly, conductive structures 122 and/or trenches 126 may have widths larger than a "cut" width of the singulation process so that at least some portion of the conductive structures and conductive material 128 remains in each SiP after singulation. For example, conductive structures 122 and/or trenches 126 may have widths greater than a dicing blade width or greater than a laser kerf width.

As singulation occurs after shield 130 is formed, there is no metal or conductive material (e.g., no shield) on the sides of encapsulant 124 in SiP 101 to couple shield 130 to ground rings 118. Conductive material 128, conductive structures 122, and metallization 120, however, may provide a vertical electrical connection between shield 130 and ground rings 118 without the need for deposition along the sides of encapsulant 124 in SiP 101. As conductive material 128, conductive structures 122, and metallization 120 provide the electrical connection between shield 130 and ground rings 118, there is no longer a need for process requirements to ensure side wall metal deposition thickness is sufficient for contact between the shield and the ground rings needed for other SiP shield processes. Additionally, since shield 130 is only formed on the upper surface of encapsulant 124, there is no need for oversputtering techniques to ensure contact between shield 130 and ground rings 118.

After singulation, SiP 101 may be coupled to another substrate (e.g., a printed circuit board). FIG. 8 depicts a side-view cross-sectional representation of an embodiment of SiP 101 coupled to printed circuit board (PCB) 150. FIG. 9 depicts a top view representation of the embodiment depicted in FIG. 8 showing conductive structures 122 and conductive material 128 around the perimeter of SiP 101. In some embodiments, as shown in FIG. 9, conductive structures 122 and conductive material 128 at least partially or substantially surround die 102 and/or passive devices 104. In certain embodiments, PCB 150 is a multilayer PCB. In certain embodiments, PCB 150 includes ground layer 152 at the bottom most surface of the PCB. Ground layer 152 may be coupled to terminals 154 on the upper surface of PCB 150. In some embodiments, SiP 101 (as part of structure 100, shown in FIG. 6) may be coupled to PCB 150 before singulation of the structure. For example, multiple SiPs 101 on structure 100 may be coupled to a large PCB, which has a size on the order of the structure. Then large PCB may be singulated with structure 100 along singulation lines 108 to provide SiP 101 on PCB 150, as shown in FIG. 8.

In certain embodiments, as shown in FIG. 8, terminals 154 are coupled to one or more of outermost terminals 114' on SiP 101. Thus, ground layer 152 is coupled to ground rings 118 in SiP 101. In certain embodiments, EMI shield 156 (heavy dashed line 156 in FIGS. 8 and 9) (e.g., a Faraday cage or fence) is formed around SiP 101 when the SiP is coupled to PCB 150. EMI shield 156 may be formed because the coupling of shield 130, conductive material 128, conductive structures 122, metallization 120, and ground rings 118 on the perimeter of SiP 101 is coupled to ground layer 152 in PCB 150. EMI shield 156 may inhibit electromagnetic interference (EMI), RFI, and/or other inter-device interference on the components in SiP 101 (e.g., die 102 and passive devices 104) during operation of the SiP.

Figure 10:
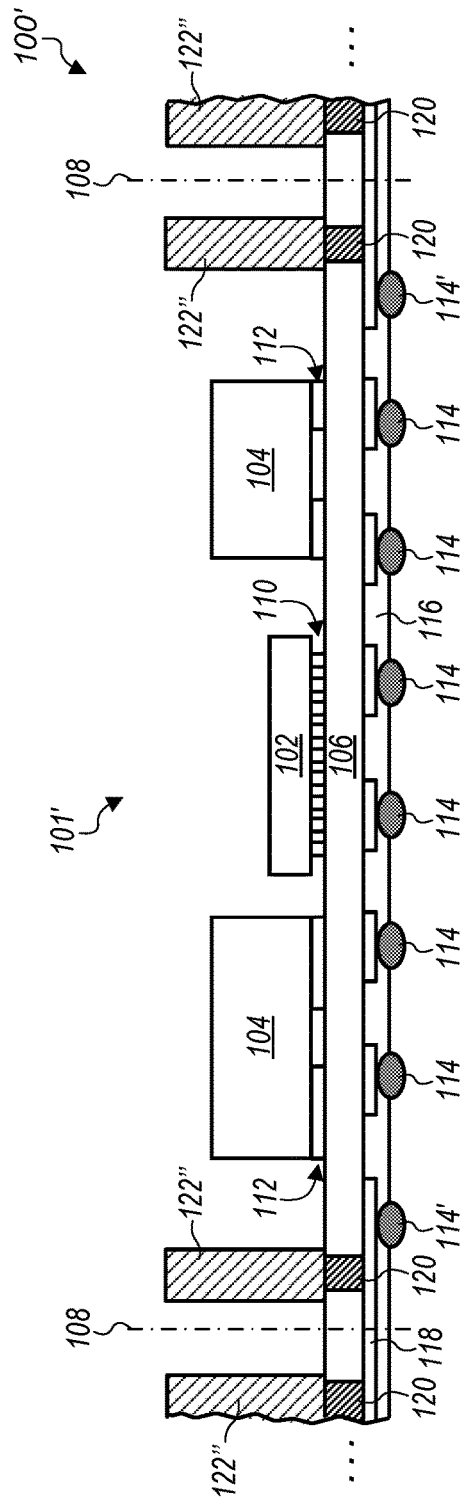
FIG. 10 depicts a side-view cross-sectional representation of an alternative embodiment of a structure used to form multiple system in packages (SiPs).

FIG. 10 depicts a side-view cross-sectional representation of an alternative embodiment of a structure used to form multiple system in packages (SiPs). Similar to structure 100, depicted in FIG. 1, structure 100' may include die 102 and passive devices 104 coupled to the upper surface of substrate 106 with terminals 114 and ground rings 118 on the lower surface of the substrate and metallization 120 through the substrate. In certain embodiments, conductive structures 122" are formed on or coupled to the upper surface of substrate 106. Conductive structures 122" may have a height above the upper surface of substrate 106 that is higher than a height of the tallest of die 102 and passive devices 104 (e.g., the conductive structures are taller than any other component/device on the upper surface of the substrate).

Figure 11:
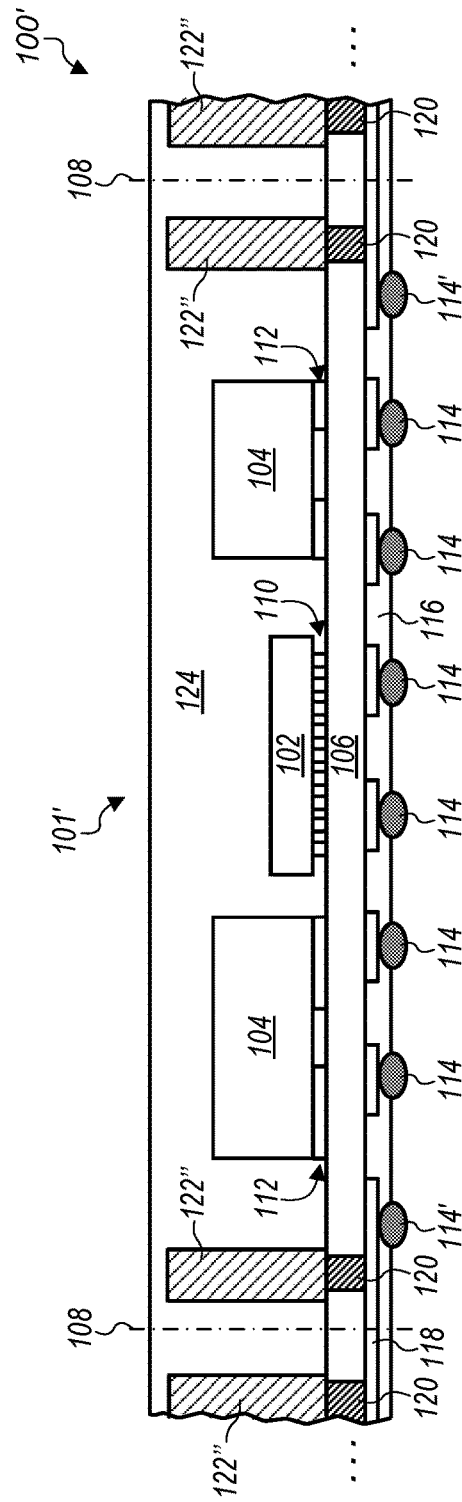
FIG. 11 depicts a side-view cross-sectional representation of an alternative embodiment of a structure encapsulated in encapsulant.
Figure 12:
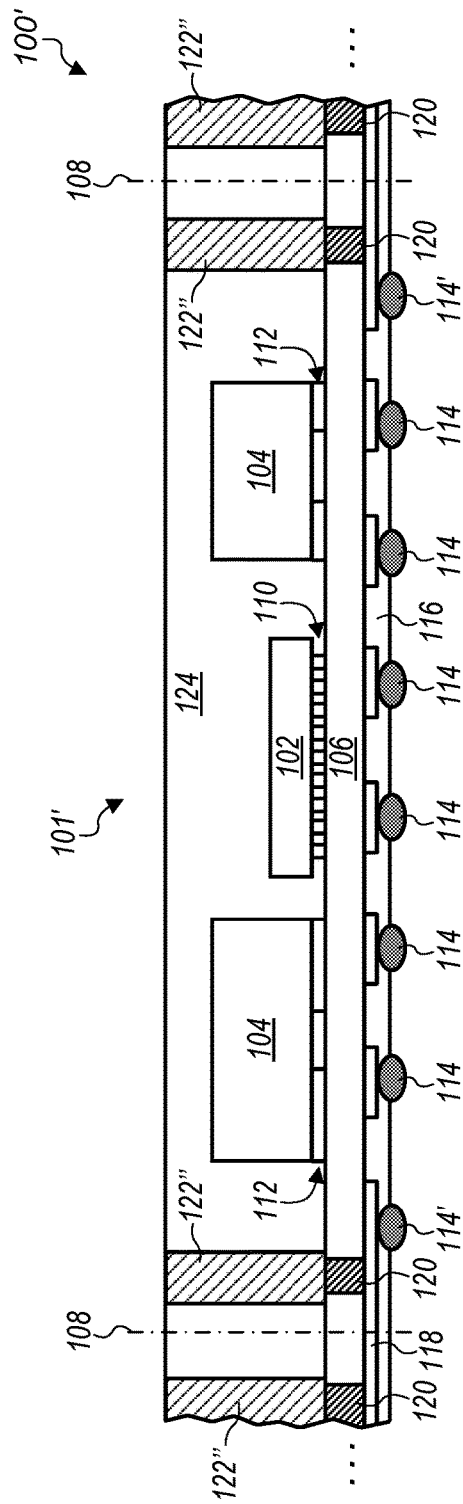
FIG. 12 depicts a side-view cross-sectional representation of an embodiment of a structure with portions of encapsulant and conductive structures removed.

Structure 100' may be encapsulated in encapsulant 124 after die 102, passive devices 104, and conductive structures 122" are on substrate 106, as shown in FIG. 11. After encapsulation, portions of encapsulant 124 and conductive structures 122" may be removed. FIG. 12 depicts a side-view cross-sectional representation of an embodiment of structure 100' with portions of encapsulant 124 and conductive structures 122" removed. Portions of encapsulant 124 and conductive structures 122" may be removed, for example, by grinding, etching, or polishing down the surfaces until a selected height is reached. Portions of encapsulant 124 and conductive structures 122" may be removed to expose the conductive structures at the upper surface of the encapsulant, as shown in FIG. 12. In certain embodiments, the selected height of conductive structures 122" and encapsulant 124 remains higher than a height of the tallest of die 102 and passive devices 104.

Figure 13:
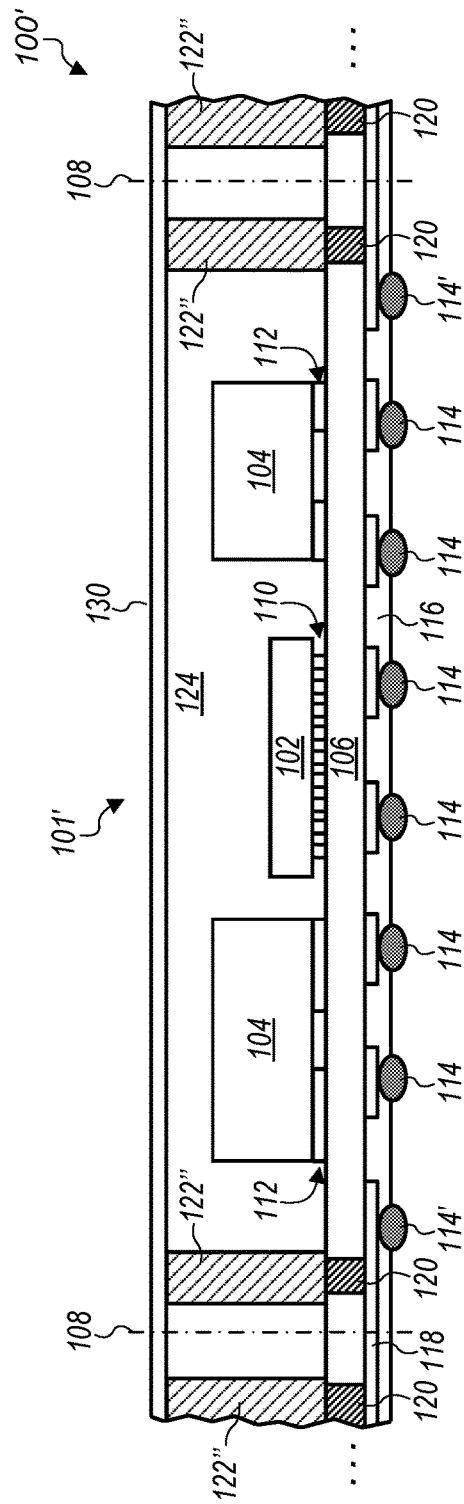
FIG. 13 depicts a side-view cross-sectional representation of an alternative embodiment of a structure with a shield formed on the structure.
Figure 14:
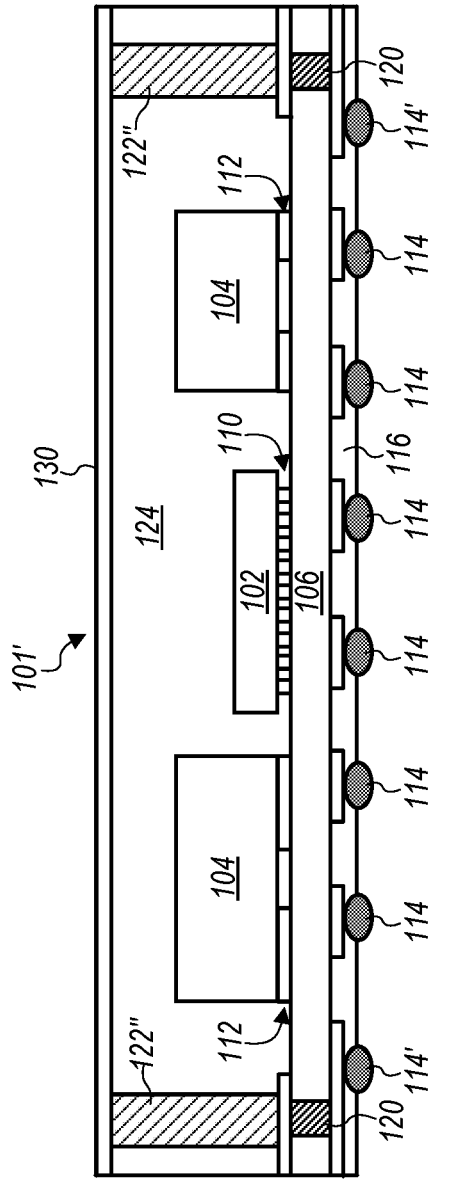
FIG. 14 depicts a side-view cross-sectional representation of an alternative embodiment of an SiP after singulation.
Figure 15:
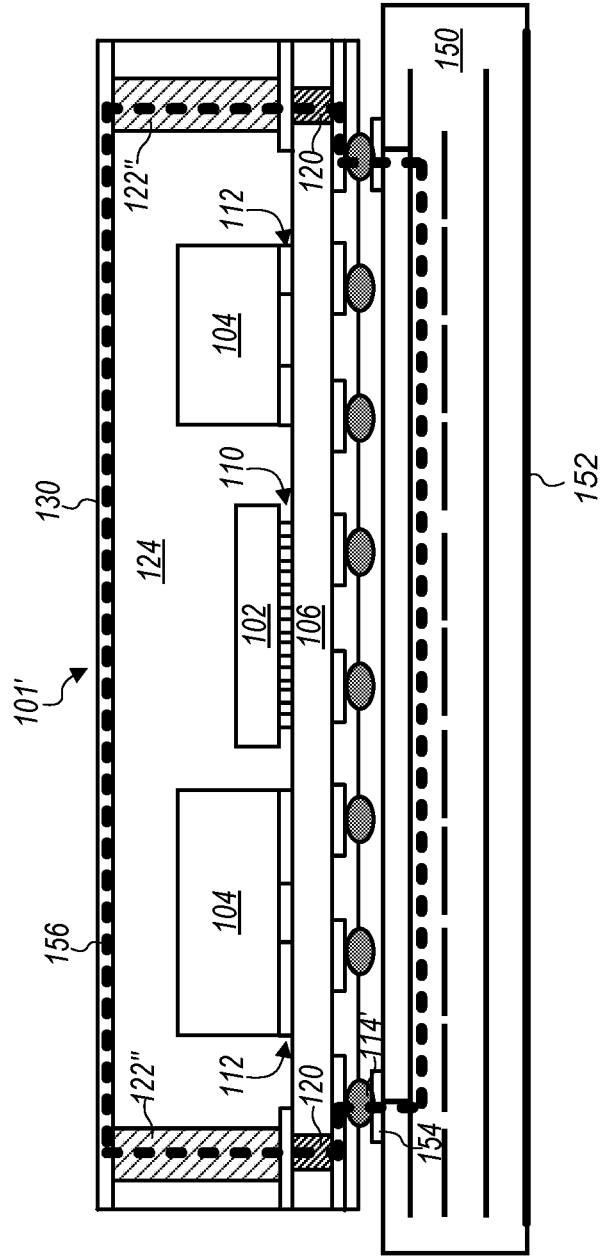
FIG. 15 depicts a side-view cross-sectional representation of an alternative embodiment of an SiP coupled to a printed circuit board (PCB).

After portions of encapsulant 124 and conductive structures 122" are removed, shield 130 may be formed on structure 100', as shown in FIG. 13. Since conductive structures 122" are exposed at the upper surface of encapsulant 124, the conductive structures couple to shield 130 when the shield is formed (e.g., deposited) on the upper surface of the encapsulant and a connection between the shield and ground rings 118 is formed. After shield 130 is formed on structure 100', the structure may be singulated along singulation lines 108 to form SiP 101', shown in FIG. 14. Similar to SiP 101, SiP 101' may be coupled to PCB 150 and EMI shield 156 may be formed around SiP 101', as shown in FIG. 15.

Figure 16:
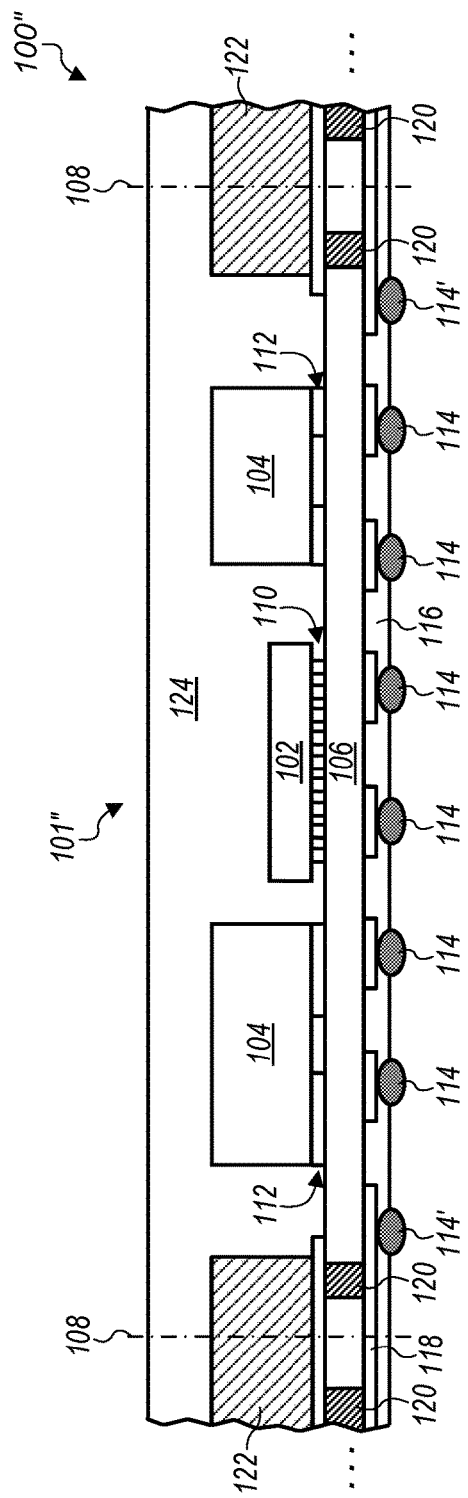
FIG. 16 depicts a side-view cross-sectional representation of yet another embodiment of a structure used to form multiple system in packages (SiPs).

FIG. 16 depicts a side-view cross-sectional representation of yet another embodiment of a structure used to form multiple system in packages (SiPs). Similar to structure 100, depicted in FIG. 3, structure 100' may include die 102, passive devices 104, and conductive structures 122 coupled to the upper surface of substrate 106 with terminals 114 and ground rings 118 on the lower surface of the substrate, metallization 120 through the substrate, and the structure encapsulated in encapsulant 124.

Figure 17:
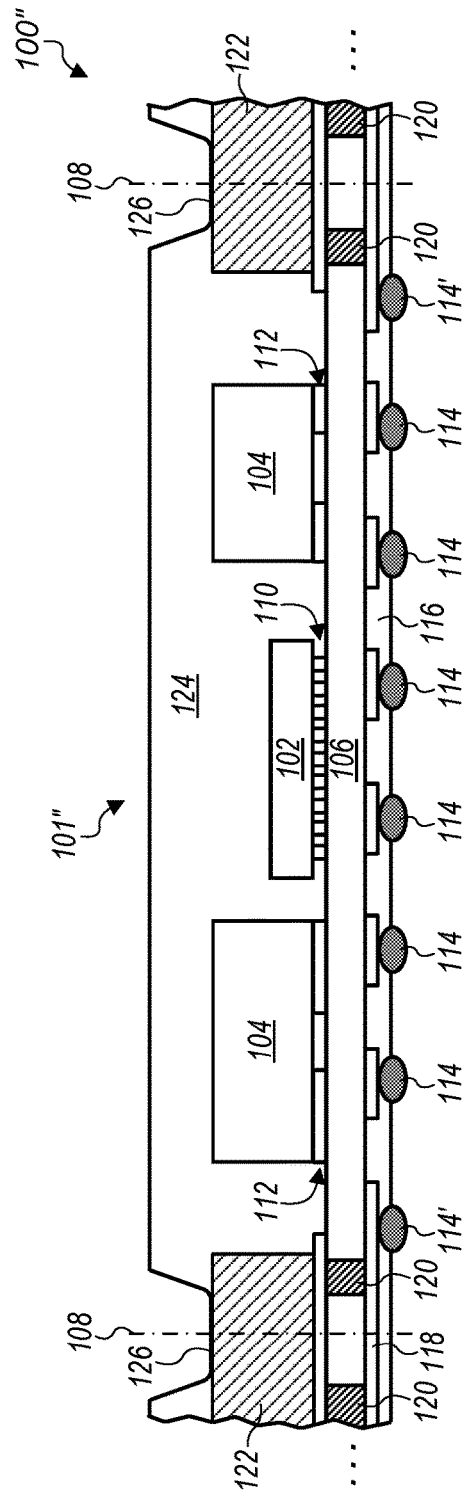
FIG. 17 depicts a side-view cross-sectional representation of yet another embodiment of a structure with trenches formed in encapsulation.
Figure 18:
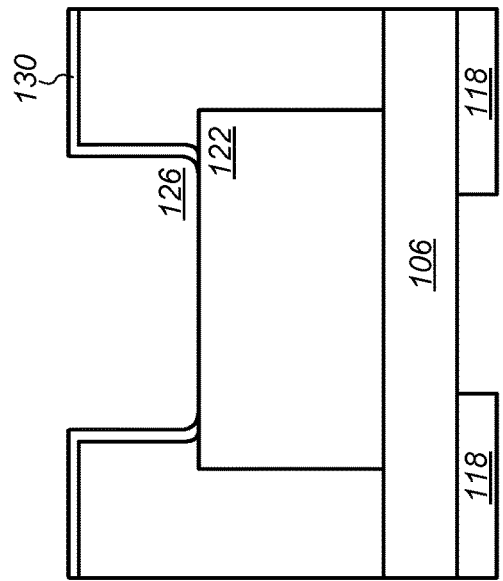
FIG. 18 depicts a side-view cross-sectional representation of an embodiment of substantially u-shaped trenches.

In certain embodiments, trenches 126 are formed in encapsulant 124, as shown in FIG. 17. Trenches 126 may be formed to connect to conductive structures 122 from the upper surface of encapsulation 124. In certain embodiments, trenches 126 are wide trenches that span across two adjacent SiPs (e.g., the trenches span singulation lines 108). Trenches 126 may, however, have a width at the bottom of the trenches less than a width of conductive structures 122. In certain embodiments, as shown in FIG. 17, trenches 126 are substantially v-shaped trenches. For example, trenches have angled (non-vertical sidewalls) down to the upper surfaces of conductive structures 122. In some embodiments, trenches 126 have different shaped trenches. For example, as shown in FIG. 18, the trenches may be substantially u-shaped trenches. As shown in FIG. 18, substantially u-shaped trenches 126 may include trenches that have substantially vertical sidewalls with slight curvature at the bottom of the trenches as the trenches meet the upper surfaces of conductive structures 122.

Figure 19:
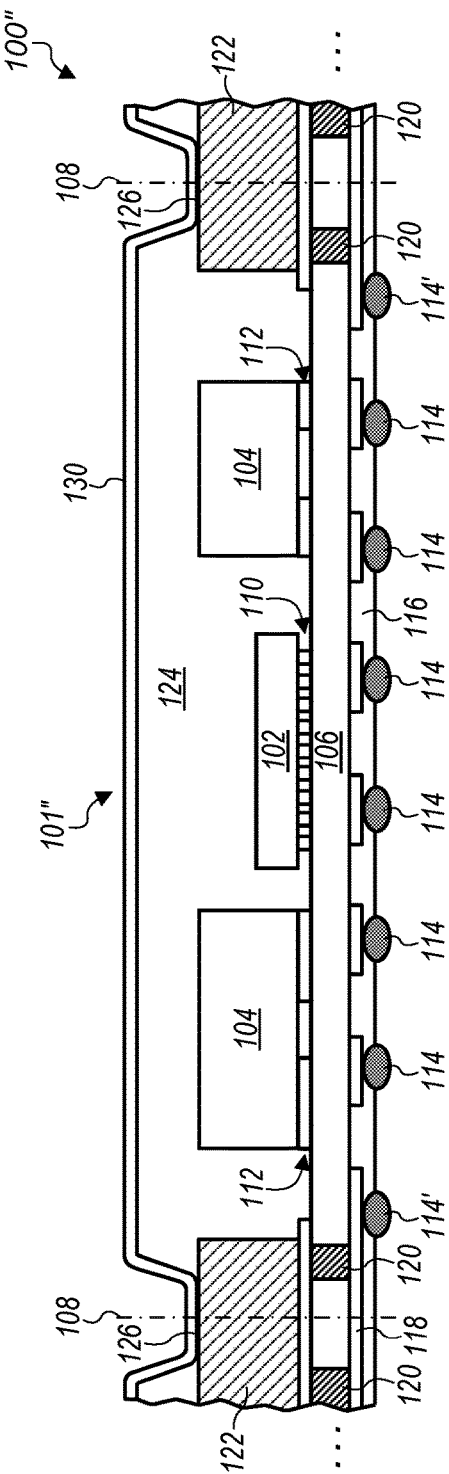
FIG. 19 depicts a side-view cross-sectional representation of yet another embodiment of a structure with a shield formed on the structure.

After trenches 126 are formed, shield 130 may be formed on the upper surface of encapsulant 124 in structure 100", as shown in FIG. 19. Shield 130 may be formed by metal deposition such as sputtering or electroplating. As shown in FIG. 19, shield 130 may be formed as a conformal film on encapsulant 124 and in trenches 126. For example, shield 130 is formed such that the shield conforms along the upper surface of encapsulant 124, into and along the sidewalls of trenches 126, and along the upper surfaces of conductive structures 122. Forming shield 130 as a conformal film forms a continuous shield along the upper surfaces of structure 100" to maintain the shield integrity on the structure.

Figure 20:
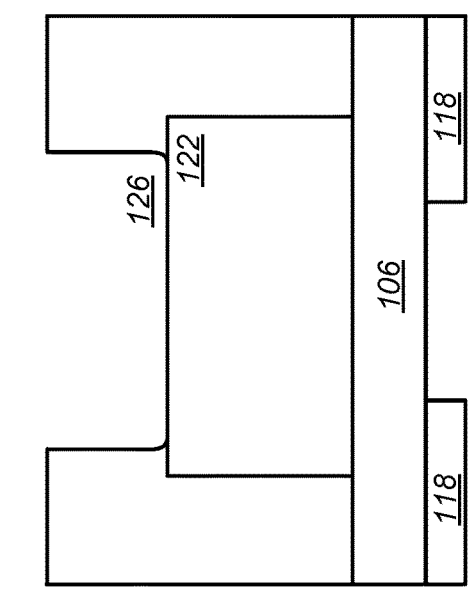
FIG. 20 depicts a side-view cross-sectional representation of an embodiment of a shield conformally formed on the substantially u-shaped trench of FIG. 18.

Trenches 126 may have widths and sidewall slopes that allow shield 130 to conform along the sidewalls of the trenches and the transition from the trenches to the upper surfaces of conductive structures 122. For example, substantially v-shaped trenches 126, as shown in FIGS. 17 and 19 provide a less than 90° transition between the trench sidewalls and the upper surface of conductive structures 122 that allow conformal deposition of shield 130 such that the shield is coupled to conductive structure 122. Trenches 126 that are substantially u-shaped trenches, as shown in FIG. 18, may have a small curved portion at or near the transition to allow conformal deposition of shield 130. FIG. 20 depicts shield 130 conformally formed on the substantially u-shaped trench of FIG. 18 such that the shield is coupled to conductive structure 122.

Figure 21:
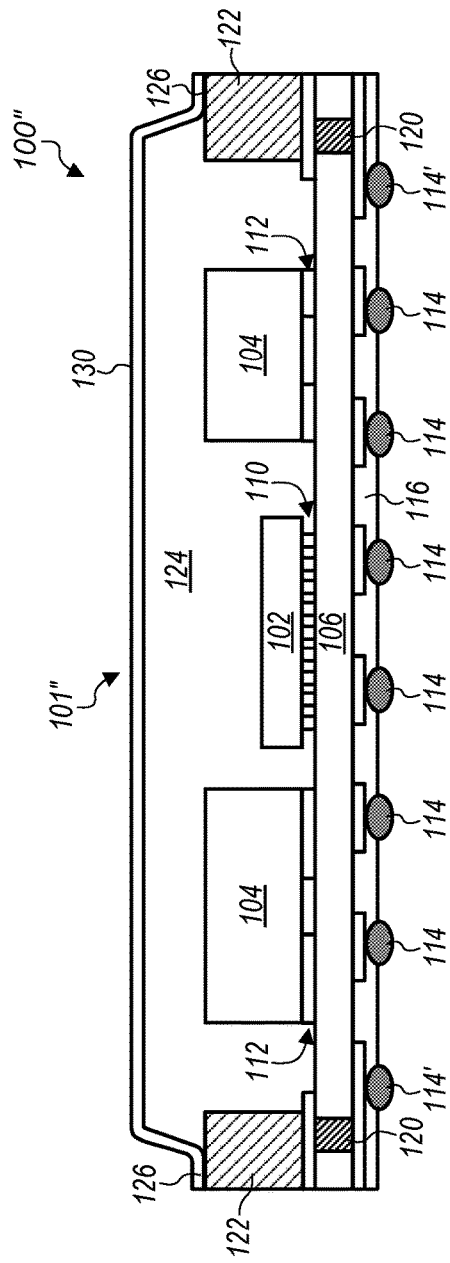
FIG. 21 depicts a side-view cross-sectional representation of yet another embodiment of an SiP after singulation.
Figure 22:
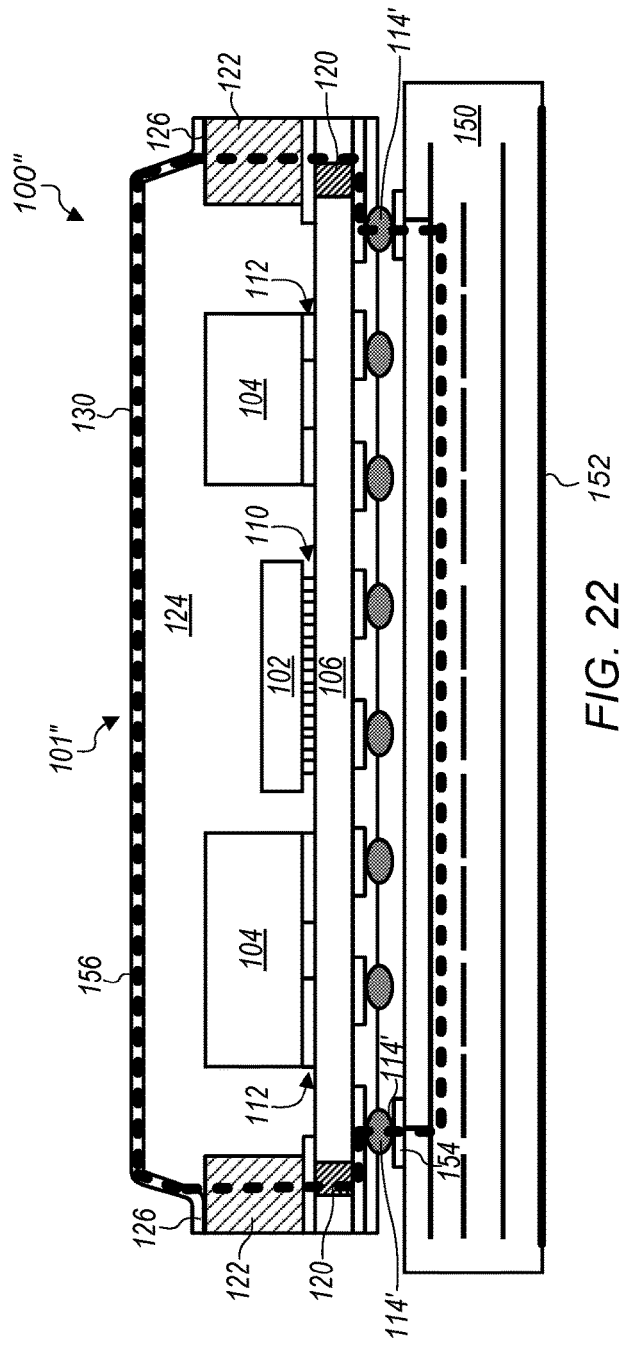
FIG. 22 depicts a side-view cross-sectional representation of yet another embodiment of an SiP coupled to a printed circuit board (PCB).

After shield 130 is formed on structure 100", the structure may be singulated along singulation lines 108 to form SiP 101", shown in FIG. 21. Similar to SiPs 101 and 101', SiP 101" may be coupled to PCB 150 and EMI shield 156 may be formed around SiP 101", as shown in FIG. 22.

In certain embodiments, as shown in FIGS. 8 and 9, conductive structures 122, conductive material 128, and metallization 120 are positioned on a perimeter of die 102 and passive components 104 for SiP 101. Similarly, SiP 101' and SiP 101" (shown in FIGS. 15 and 22, respectively) have conductive structures and metallization on the perimeter of die 102 and passive components 104. In some embodiments, however, conductive structures 122, metallization 120, and/or conductive material 128 may be located between die and passive components or between passive components to provide compartmented shielding within an SiP.

Figure 23:
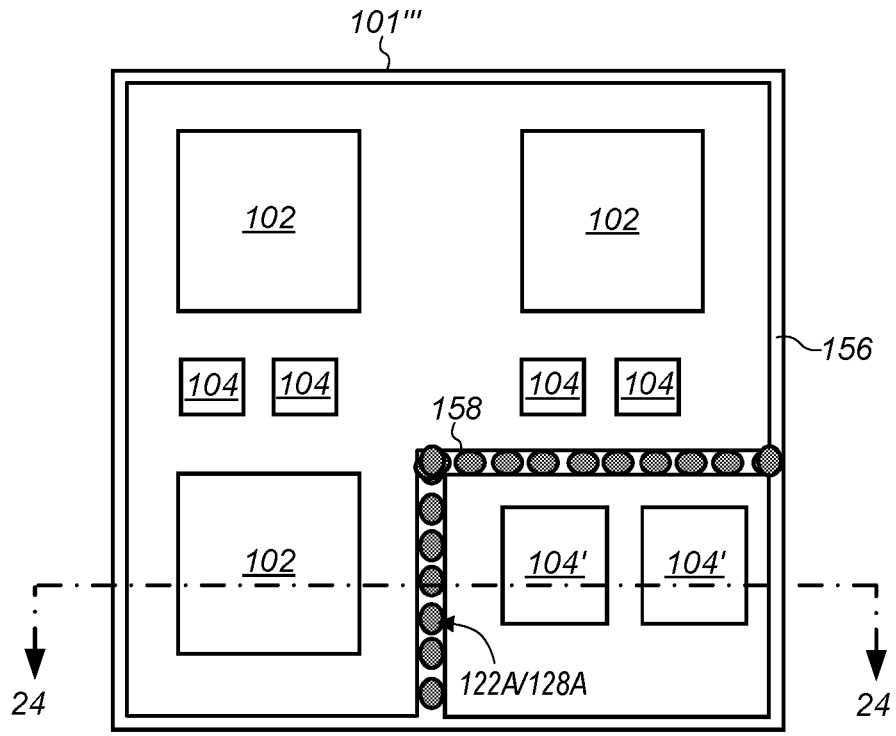
FIG. 23 depicts a top view representation of an embodiment of an SiP with a compartment (interior) shield formed inside an EMI shield.

FIG. 23 depicts a top view representation of an embodiment of SiP 101''' with compartment (interior) shield 158 formed inside EMI shield 156. In certain embodiments, compartment shield 158 provides a compartmental shield around passive devices 104' (e.g., between the devices inside the compartmental shield and die 102 and passive devices 104 outside the compartmental shield). In certain embodiments, compartment shield 158 is formed around passive devices 104'. Compartment shield 158 may, however, be formed around any combination of passive devices and die as desired.

Figure 24:
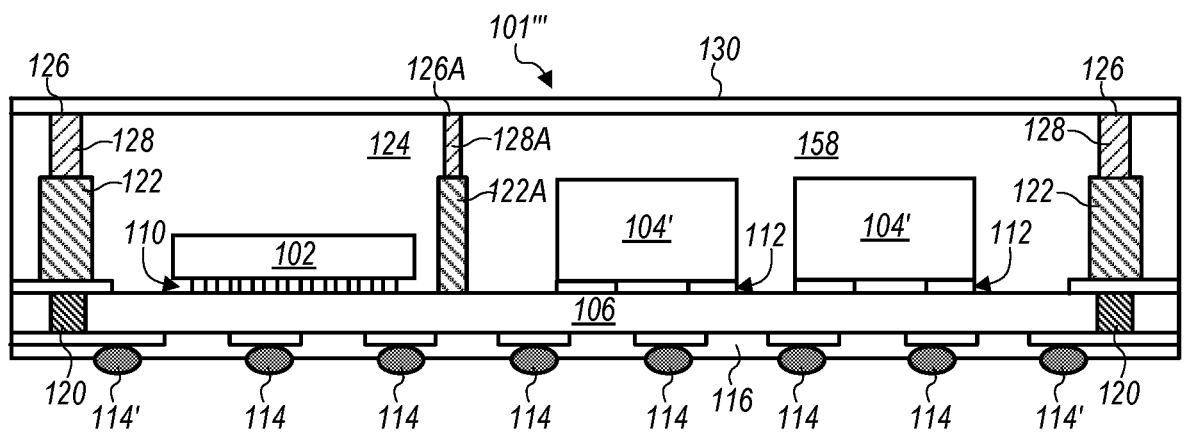
FIG. 24 depicts a side-view cross-sectional representation of an embodiment of SiP with a compartment shield around a passive device.

Compartment shield 158 may be formed by providing one or more vertical connections between ground rings 118 and shield 130 between passive devices 104' and other components. FIG. 24 depicts a side-view cross-sectional representation of an embodiment of SiP 101''' with compartment shield 158 around passive devices 104'. As shown in FIG. 24, conductive structure 122A and conductive material 128A in trench 126A are positioned between passive devices 104' and die 102 to form compartment shield 158 around the passive device. In certain embodiments, conductive structure 122A and conductive material 128A are thinner (narrower) than conductive structures and conductive materials used on the perimeter of SiP 101'''. It is to be understood that while FIG. 24 depicts an embodiment of SiP 101''' using conductive structures 122 and conductive material 128 for the vertical connection between shield 130 and ground rings 118, any embodiment of vertical connection described herein may be used to provide the connections in an embodiment of SiP 101'''.

In some embodiments, conductive structures 122 and/or conductive material 128, as described herein, include magnetic fillers to provide magnetic shielding. For example, conductive material 128 may a paste filled with both conductive and magnetic fillers. Adding magnetic fillers to conductive structures 122 and/or conductive material 128 may provide magnetic shielding in combination with electrical shielding in EMI shield 156.

Figure 25:
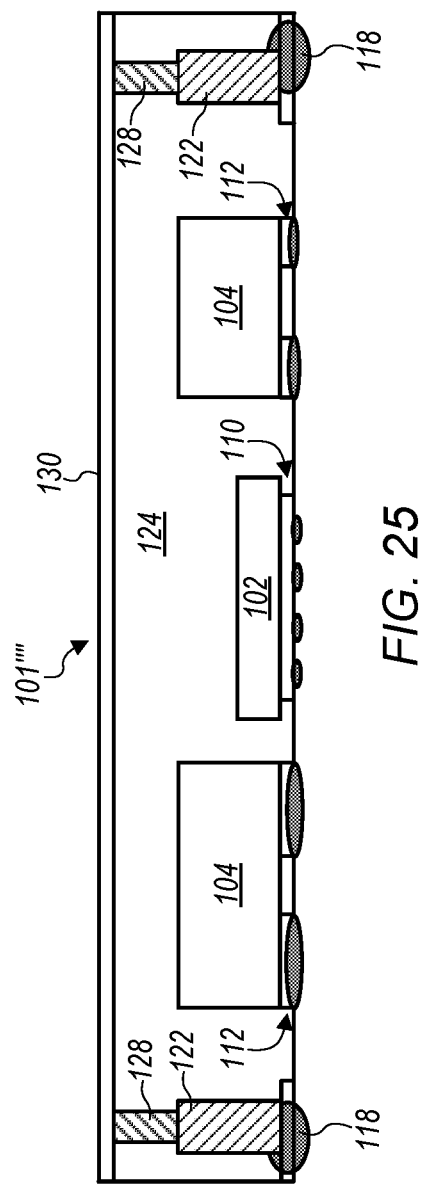
FIG. 25 depicts a side-view cross-sectional representation of an embodiment of a substrate-less SiP after singulation.

In some embodiments, as described herein, substrate 106 is a temporary substrate (e.g., substrate 106 in FIG. 7 is a temporary substrate). The temporary substrate may be removed to form a substrate-less SiP. FIG. 25 depicts a side-view cross-sectional representation of an embodiment of substrate-less SiP 101'''' after singulation. As shown in FIG. 25, ground rings 118 may be lower terminals for conductive structures 122. Terminals 110 and 112 may be used to couple die 102 and passive devices 104, respectively, to another substrate (e.g., a PCB).

Further modifications and alternative embodiments of various aspects of the embodiments described in this disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as the presently preferred embodiments. Elements and materials may be substituted for those illustrated and described herein, parts and processes may be reversed, and certain features of the embodiments may be utilized independently, all as would be apparent to one skilled in the art after having the benefit of this description. Changes may be made in the elements described herein without departing from the spirit and scope of the following claims.

What is claimed is:

1. A semiconductor device package, comprising:
   at least one device;
   an encapsulant at least partially encapsulating the at least one device;
   one or more terminals coupled to a lower surface of the at least one device;
   a plurality of conductive structures at least partially encapsulated in the encapsulant, wherein the plurality of conductive structures comprise discrete structures at least partially surrounding the at least one device in the encapsulant, wherein at least one conductive structure has a height equal to or greater than a height of the at least one device;
   a conductive material coupled to the at least one conductive structure that has the height equal to or greater than the height of the at least one device;
   one or more ground terminals coupled to lower surfaces of the conductive structures; and
   a shield positioned above the at least one device and the conductive structures, wherein the shield is coupled to the at least one conductive structure that has the height equal to or greater that the height of the at least one device with the conductive material, and wherein the shield is electrically coupled to at least two of the conductive structures.

2. The package of claim 1, wherein the package comprises a substrate-less package.

3. The package of claim 1, wherein the at least two conductive structures electrically coupled to the shield are separately attached to the shield.

4. The package of claim 1, wherein the at least two conductive structures electrically coupled to the shield are attached to the shield using the conductive material.

5. The package of claim 1, wherein the shield is positioned over the encapsulant.

6. The package of claim 1, wherein the at least one device comprises a passive device.

7. The package of claim 1, wherein the at least one device comprises an active device.

8. The package of claim 1, wherein at least one of the conductive structures comprises a metal structure.

9. The package of claim 1, wherein the at least one device comprises at least a first device and a second device at least partially encapsulated in the encapsulant, and wherein at least one conductive structure is located between the first device and the second device in the encapsulant.

10. A semiconductor device package, comprising:
an encapsulant;
a first device at least partially encapsulated in the encapsulant;
a second device at least partially encapsulated in the encapsulant;
one or more terminals coupled to lower surfaces of the first device and the second device;
a plurality of conductive structures at least partially encapsulated in the encapsulant, wherein the plurality of conductive structures at least partially surround the first device in the encapsulant, wherein at least one conductive structure is located between the first device and the second device in the encapsulant, and wherein at least some of the conductive structures are positioned along a perimeter of the package, at least one of the conductive structures positioned along the perimeter of the package being encapsulated in the encapsulant;
one or more ground terminals coupled to lower surfaces of the conductive structures; and
a shield positioned above the first device, the second device, and the conductive structures, wherein the shield is electrically coupled to at least two of the conductive structures.

11. The package of claim 10, wherein the package comprises a substrate-less package.

12. The package of claim 10, wherein at least two of the conductive structures are separately attached to the shield.

13. The package of claim 10, wherein the first device comprises a passive device.

14. The package of claim 10, wherein the second device comprises an active device.

15. The package of claim 10, wherein the shield is positioned over the encapsulant.

16. A semiconductor device package, comprising:
at least one device;
an encapsulant at least partially encapsulating the at least one device;
one or more terminals coupled to a lower surface of the at least one device;
a plurality of conductive structures at least partially encapsulated in the encapsulant, wherein the conductive structures at least partially surround the at least one device in the encapsulant, wherein at least one conductive structure has a height equal to or greater than a height of the at least one device;
a conductive material coupled to the at least one conductive structure that has the height equal to or greater than the height of the at least one device;
one or more ground terminals coupled to lower surfaces of the conductive structures; and
a shield positioned above the at least one device and the conductive structures, wherein the shield is coupled to the at least one conductive structure that has the height equal to or greater than the height of the at least one device with the conductive material, and wherein the shield is electrically coupled to at least two of the conductive structures, the at least two conductive structures being separately attached to the shield.

17. The package of claim 16, wherein the package comprises a substrate-less package.

18. The package of claim 16, wherein the at least two conductive structures are attached to the shield using the conductive material.

19. The package of claim 16, wherein the at least two conductive structures electrically couple the shield to at least one of the ground terminals.

* * * * *